(12) United States Patent
Mallon

(10) Patent No.: US 6,246,808 B1
(45) Date of Patent: Jun. 12, 2001

(54) OPTICAL SWITCH APPARATUS

(75) Inventor: Charles A. Mallon, Chesterfield Township, MI (US)

(73) Assignee: TRW Inc., Lyndhurst, OH (US)

( * ) Notice: Subject to any disclaimer, the term of this patent is extended or adjusted under 35 U.S.C. 154(b) by 0 days.

(21) Appl. No.: 09/316,853

(22) Filed: May 21, 1999

(51) Int. Cl.[7] .................................................. G02B 6/26
(52) U.S. Cl. .............................................................. 385/16
(58) Field of Search ................................. 385/16; 257/96, 257/103; 372/45; 438/37, 47, 87, 94, 936

(56) References Cited

U.S. PATENT DOCUMENTS

| | | | |
|---|---|---|---|
| 4,032,951 | * 6/1977 | DeWinter et al. | 372/45 |
| 4,072,544 | * 2/1978 | DeWinter et al. | 438/37 |
| 4,417,824 | 11/1983 | Paterson et al. . | |
| 4,878,722 | 11/1989 | Nelson et al. . | |
| 5,721,794 | 2/1998 | Uchiyama et al. . | |

* cited by examiner

Primary Examiner—Akm E. Ullah
(74) Attorney, Agent, or Firm—Tarolli, Sundheim, Covell, Tummino & Szabo L.L.P.

(57) ABSTRACT

An optical switch apparatus (110) includes a light source (112) that emits light (114) to a light emitting diode (LED) (116) which is responsive to the light (114) from the light source (112). In response to receiving light (114) from the light source (112), the LED (116) has a biased condition in which the LED (116) is effective to conduct electrical current. The LED (116) also has an unbiased condition in the absence of receiving light from the light source. The switch apparatus (110) also includes a switch (124) operatively connected with the LED (116) and responsive to the condition of the LED (116). The LED (116) effects operation of the switch (124) in a first operative state when the LED (116) is in the biased condition. The LED (116) effects operation of the switch (124) in a second operative state different from the first operative state when the LED (116) is in the unbiased condition.

18 Claims, 2 Drawing Sheets

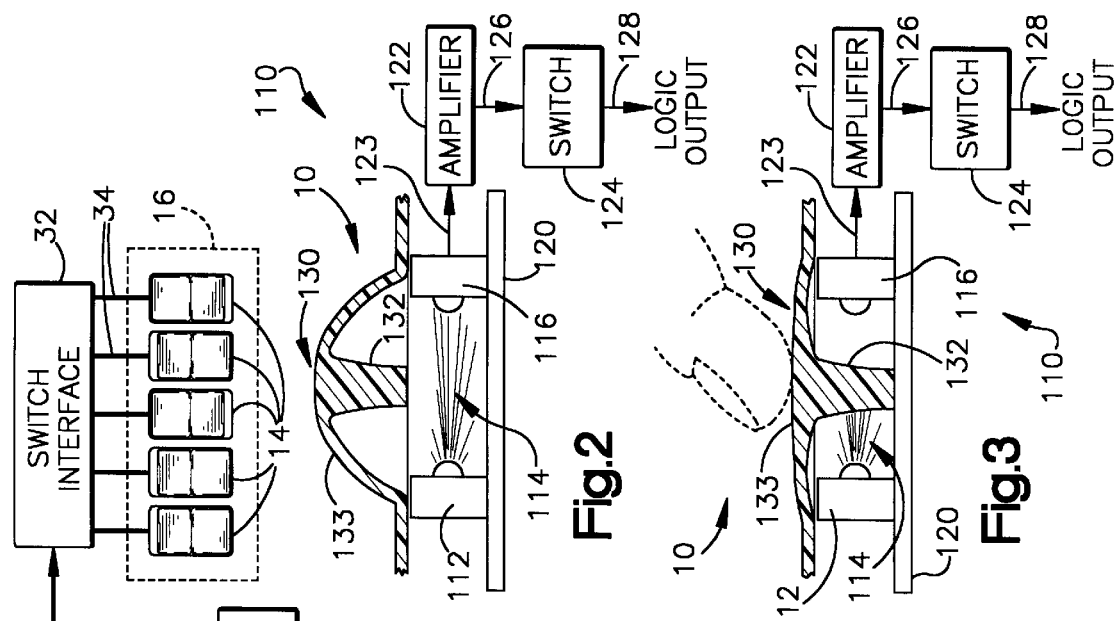
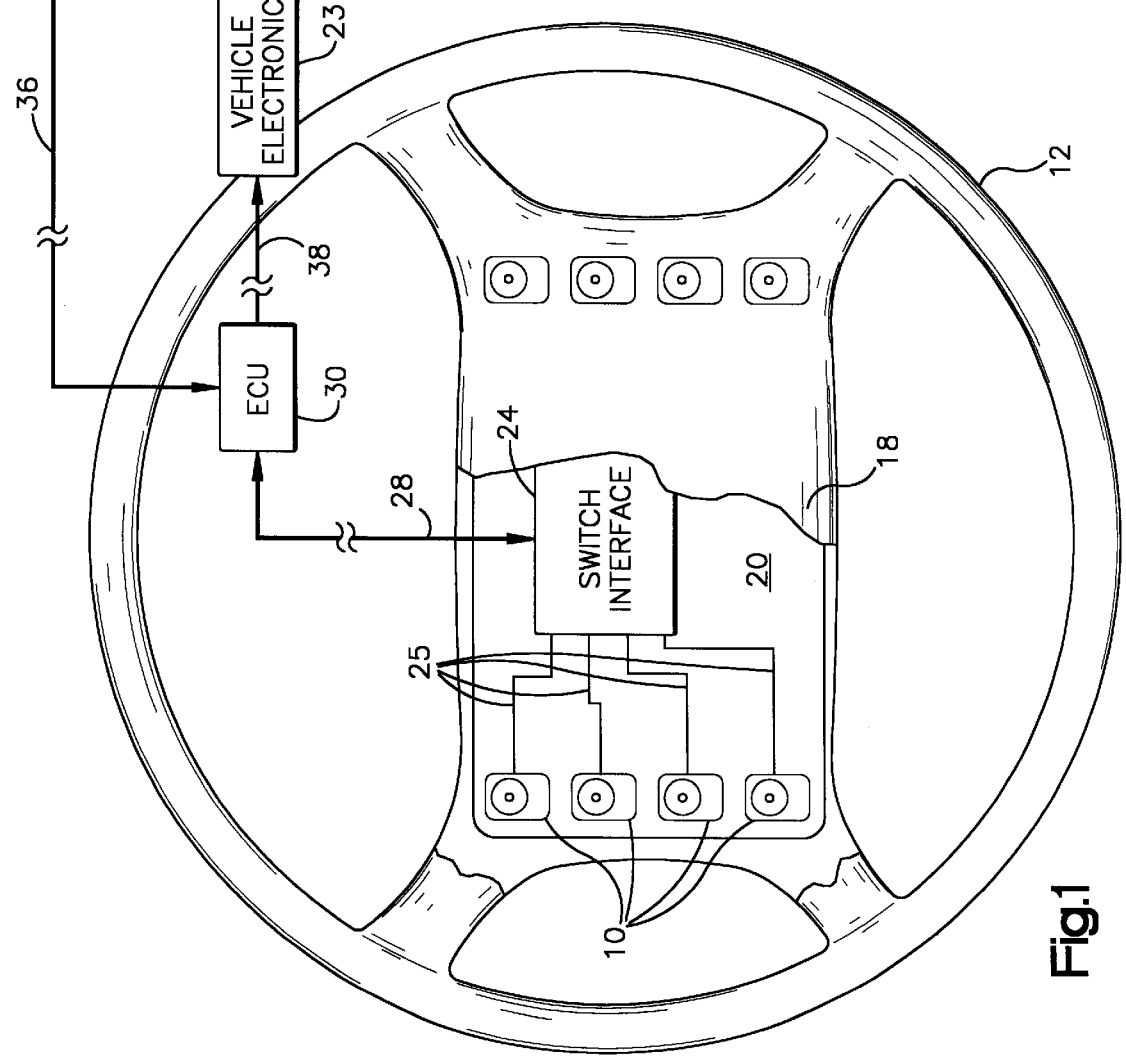

OPTICAL SWITCH APPARATUS

TECHNICAL FIELD

The present invention relates to a switch apparatus and, more particularly, to an optical switch apparatus and a method for controlling an optical switch.

BACKGROUND OF THE INVENTION

It is common to control operation of electronic devices in response to the state of a switch. One particular type of switch makes the operation of the switch dependent upon the passage of light from a light source to a light detector. A conventional optical switch utilizes a light source, such as a light emitting diode (LED), and one or more optical detectors, typically photodetectors, to detect the light from the source. Examples of existing optical switches are disclosed in U.S. Pat. Nos. 4,417,824, 4,878,722 and Nos. 5,721,794. Each of these U.S. patents utilizes various structures for interrupting the passage of light between the optical transmitter and associated optical detector. A signal is derived from the optical detector to control operation of associated equipment.

SUMMARY OF THE INVENTION

The present invention is an optical switch apparatus comprising a light source which emits light and a light emitting diode (LED) having a condition responsive to the light emitted from the light source. In response to receiving light from the light source, the LED has a biased condition in which the LED is effective to conduct electrical current. The LED also has an unbiased condition in the absence of receiving sufficient light from the light source. The apparatus also includes a switch operatively connected with the LED and responsive to the condition of the LED. The LED effects operation of the switch in a operative state when the LED is in the biased condition. The LED effects operation of the switch in a second operative state different from the first operative state when the LED is in the unbiased condition. Preferably, the biased condition occurs when the LED is operating in a reverse bias mode.

The present invention is also directed to a method for controlling an electrical switch in response to the passage of light from a light source to an adjacent light emitting diode (LED). The method includes the steps of supplying light from the light source and receiving light from the light source at the LED. Upon receiving light from the light source, the LED conducts electrical current in a reverse bias mode which, in turn, effects operation of the electrical switch in a first operative state.

BRIEF DESCRIPTION OF THE DRAWINGS

The foregoing and other features and advantages of the invention will become more apparent to one skilled in the art upon consideration of the following description of the invention and the accompanying drawings in which:

FIG. 1 is a schematic representation of a preferred embodiment of the invention including a plurality of switch actuator assemblies in accordance with the invention shown in combination with a vehicle dashboard and a vehicle steering wheel;

FIG. 2 is a schematic view of a switch apparatus including a switch actuator assembly in accordance with a first embodiment of the present invention, shown in a first operative condition;

FIG. 3 illustrates the switch actuator assembly of FIG. 2 in a second operative condition;

DESCRIPTION OF PREFERRED EMBODIMENTS

Figure 4:
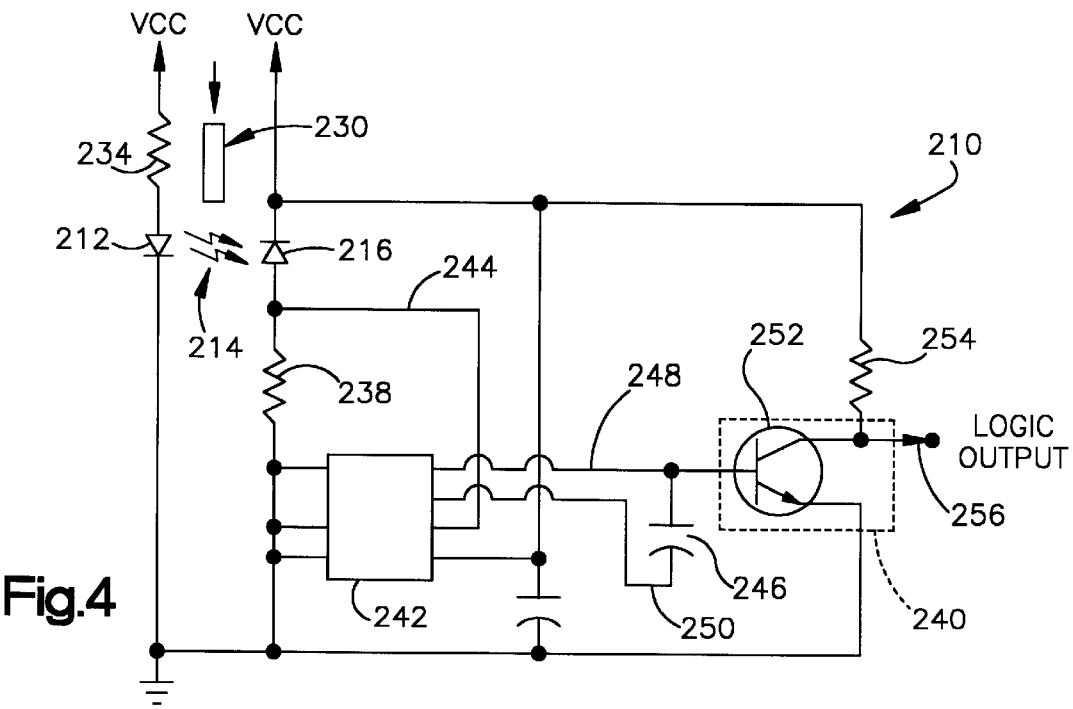
FIG. 4 is a circuit diagram of a switch apparatus in accordance with the present invention.

FIG. 1 illustrates a plurality of push-button type switch actuator assemblies 10 in combination with a vehicle steering wheel 12. The steering wheel 12 includes a steering wheel cover 18 overlying a substrate which preferably includes a printed circuit board 20 to which the switch actuator assemblies 10 are mounted. The steering wheel cover 18 may be integrally molded over at least part of the circuit board 20.

Each switch actuator assembly 10 is electrically connected with a switch interface 24 by a respective electrical connection 25. The switch interface 24 is mounted to the circuit board 20. The switch interface 24 receives and distributes the switching signals provided by the switch actuator assemblies 10. The switch interface 24 also may distribute control signals to each switch actuator assembly 10 over the electrical connections 25, for example, to illuminate desired switch actuator assemblies 10.

The switch interface 24 provides, to an electronic control unit (ECU) 30, one or more signals 28 indicative of the operative state of each switch assembly 10. The ECU 30 may be mounted to or be separate from the circuit board 20. The ECU 30 preferably is a microcomputer or microprocessor programmed for controlling associated electronic equipment 23.

A plurality of rocker-type switch actuator assemblies 14 are illustrated as part of a vehicle dashboard, illustrated schematically at 16. Each switch actuator assembly 14 is electrically connected with a switch interface 32 by electrical connections 34. The switch interface 32 may be part of the same printed circuit board to which the switch actuator assemblies 14 are mounted or, alternatively, may be separate. The switch interface 32 provides electrical signals 36 to the ECU 30 indicative of the operative state of each switch actuator assembly 14.

Each switch actuator assembly 10 or 14, described below in detail, controls operation of the associated vehicle electronic equipment 23. Such vehicle equipment 23 may include, for example, a vehicle horn, HVAC controls, radio controls, speed control, turn signals, wiper controls, cellular telephone controls, temperature controls, and trip computer.

The electric signals 28 and 36 provided by the respective switch interfaces 24 and 32 may be communicated to the ECU 30 as digital signals over conventional wired or wireless communication links, or over fiber optic connections. The particular communication scheme is a matter of design choice and, therefore, is not explained in detail. It also will be appreciated that other types of control circuitry may be used to control operation of the electronic equipment 23 associated with the switch actuator assemblies 10 and 14. For example, each one of the switch actuator assemblies 10 and 14 might be electrically connected with its associated equipment, such as through appropriate driver circuits and with no intervening switch interface or ECU.

FIGS. 2 and 3 illustrate an optical switch apparatus 110, including a switch actuator assembly 10, in accordance with a first embodiment of the present invention. The switch actuator assembly 10 (FIG. 2) includes a light source, preferably a first LED 112, that emits light indicated at 114. The switch actuator assembly 10 includes a second LED 116 adjacent to and spaced apart from the light source 112. Both the light source 112 and the second LED 116 are mounted to a suitable substrate, such as a printed circuit board 120. The light source 112 emits the light 114, preferably in the infrared range, in the direction of the LED 116.

The LED 116 is responsive to the wavelength of light 114 emitted from the light source 112. Specifically, the LED 116 has a biased condition, responsive to receipt of the light 114, in which it is effective to conduct electrical current through the LED 116.

The switch apparatus 110 also includes an amplifier circuit 122. A signal indicative of the electrical current conducted through the LED 116 is provided to the amplifier circuit 122 over electrical connection 123. The amplifier circuit 122 preferably is mounted to the circuit board 120.

The switch apparatus 110 also includes a switch element or switch 124. The amplifier circuit 122 is configured to have an appropriate gain to amplify the current signal from the LED 116 to a level sufficient to control activation of the switch 124. The amplifier circuit 122 provides the amplified signal to the switch 124 though an electrical connection 126. The switch 124 then provides a switched output signal, indicated as logic output 128, in response to the amplified signal. The switched output signal indicates whether the LED 116 is receiving light from the light source 112. The output signal at the logic output 128 may be provided to a suitable switch interface, such as the switch interface 24 or 32 shown in FIG. 1, or directly to associated electronic equipment.

In order to interrupt the passage of light 114 from the LED 112 to the LED 116, the switch actuator assembly 10 includes a shutter mechanism which may be of the type shown at 130 in FIGS. 2 and 3. The shutter mechanism 130 includes a substantially opaque blade 132 which is movable between the first and second LEDs 112 and 116. In the embodiment of FIGS. 2 and 3, the blade 132 extends from a resilient housing 133 towards the PC board 120. The housing 133 is mechanically biased to support the blade 132 in a rest position, shown in FIG. 2. When the blade 132 is in the rest position, light 114 from the light source 112 passes substantially unimpeded to the LED 116.

The top of the housing 133 when manually pressed moves the blade 132 toward the circuit board 120 and into an actuated position located between the light source 112 and the LED 116. When the blade 132 is in the actuated position, it prevents the passage of light from the light source 112 to the LED 116. The shutter mechanism 130 preferably is formed of a resilient and flexible material, such as rubber or plastic, having sufficient memory to return the blade 132 from the actuated position to the rest position when released.

When the blade 132 is in the rest position of FIG. 2, permitting the passage of light from the light source 112 to the LED 116, the LED 116 is biased and therefore conducts electrical current. The amplifier 122 provides an amplified signal to the switch 124 which, in turn, provides a corresponding logic signal at output 128.

FIG. 3 illustrates the shutter mechanism 130 including the blade 132 impeding the passage of light 114 from the light source 112 to the LED 116. In the absence of receiving a sufficient amount of light from the light source 112, the LED 116 is in an unbiased condition in which it does not conduct electric current. The input signal 123 to the amplifier 122 has a value indicating no current flow through the LED 116. This, in turn, results in the switch 124 providing a signal at logic output 128 indicating the unbiased condition of the LED 116.

In this manner, movement of the shutter mechanism 130 may be monitored and used to control operation of associated electric equipment. It will be understood that other types of shutter mechanisms may be used in accordance with the present invention. For example, virtually any substantially opaque member may be moved between the light source 112 and the LED 116 to impede the receipt of light by, and change the operative condition of, the LED 116. The switch apparatus 110 also preferably includes a suitable enclosure to prevent ambient light from interfering with operation of the switch apparatus.

FIG. 4 is a circuit diagram illustrating the electrical operation of an optical switch apparatus 210 in accordance with the present invention. The switch apparatus 210 operates in a manner similar to that of the switch apparatus 110. Specifically, the switch apparatus 210 includes a light source 212 that emits light 214 in a direction toward an adjacent light emitting diode 216. The light source 212 preferably is a forward biased LED having an anode connected with the voltage control channel (VCC), suitably about 5 volts DC, through a resistor 234. The LED 212 also has a cathode connected with electrical ground potential. A shutter 230 is movable to interrupt the passage of light from the LED 212 to the LED 216, such as by pressing an associated button or lever or housing.

The LED 216 operates in a reverse bias mode in response to light received from the LED 212. Specifically, the LED 216 has a cathode electrically connected with VCC and an anode electrically connected with electrical ground through a suitable resistor 238. Therefore, when the LED 216 receives light 214, it operates in the reverse bias mode and conducts electric current which flows from its cathode to its anode. The electric current flowing through the LED 216 is used to effect activation of an electric switch 240.

The amount of electric current conducted through the LED 216 in the reverse bias mode is substantially low. Consequently, the voltage drop across the resistor 238 also is substantially low. The apparatus 210 therefore, includes an amplifier 242. The amplifier 242 has an input 244 connected to the juncture between the anode of the LED 216 and the resistor 238, for detecting the voltage drop across the resistor 238.

The amplifier 242 has sufficient gain to amplify the voltage at the input 244 to a level suitable for controlling activation of the switch 240. A capacitor 246 is electrically connected between output 248 and output 250 of the amplifier 242 to help stabilize the amplifier output signal. The output signal at output 248 is provided to the input of the switch 240.

The switch 240 preferably includes a bipolar junction transistor switch 252 having a base connected with the output 248 of the amplifier 242. The transistor switch 252 also has an emitter connected with electrical ground potential and a collector electrically connected with VCC through a resistor 254. The juncture between resistor 254 and the collector provides a logic output 256 which may be used to control associated electronic equipment. For example, the logic output 256 may be provided to the switch interface 24 or 32 (FIG. 1) which is connected to the ECU 30. The ECU 30, in turn, provides a control signal 38 to control operation of appropriate vehicle electronics 23 according to the operative condition of the LED 216. Other types of transistors or switch circuitry also may be used to derive suitable logic signals in response to the operative state of the LED 216.

In this preferred embodiment, the logic output 256 provides an inverted logic signal in response to the operative condition of the LED 216. Specifically, when the LED 216 is conducting electrical current in the reverse bias mode in response to receiving light 214, the transistor switch 252 is ON. This results in electrical current being conducted through the resistor 254 and through the transistor switch 252 to electrical ground. While the transistor switch 252 is ON, the logic output 256 is about equal to the voltage drop across the active transistor switch 252, typically less than about 1 volt. This corresponds to a logic LOW signal.

On the other hand, when the LED 216 is not receiving light 214 from the light source 212, the transistor switch 252 is OFF. This, in turn, causes the logic output 256 to have a voltage substantially equal to VCC, which corresponds to a logic HIGH signal. Thus, the logic output 256 provides, in either case, a signal having a value indicative of the operative condition of the LED 116.

Figure 5:
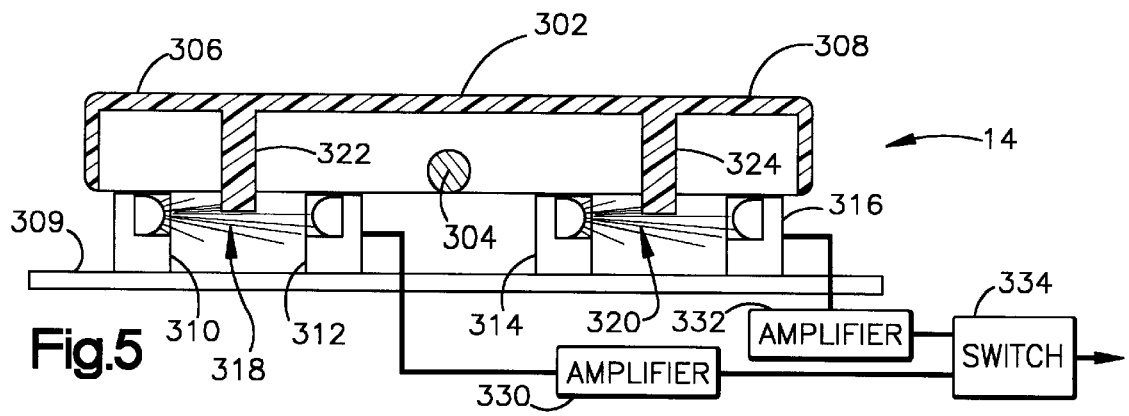
FIG. 5 is a view similar to FIG. 2 of a switch actuator assembly in accordance with a second embodiment of the present invention, shown in a first operative condition.
Figure 6:
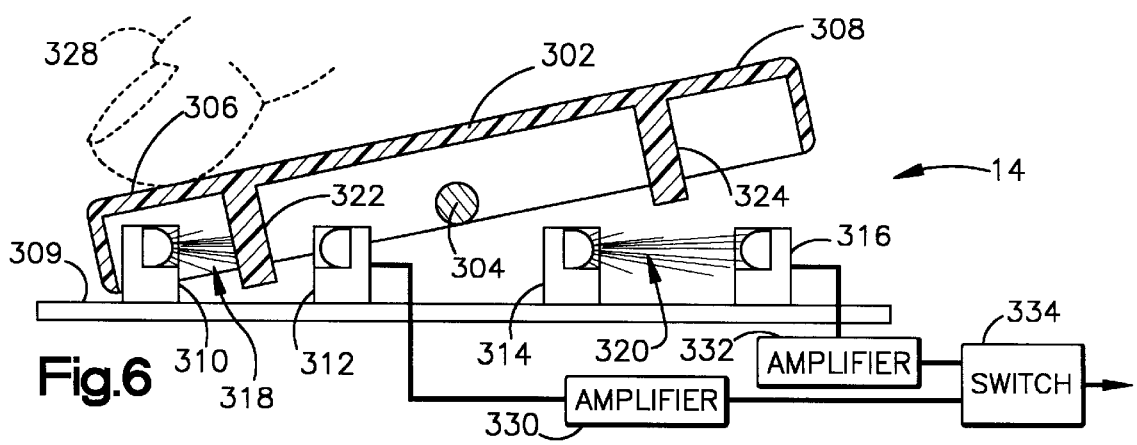
FIG. 6 shows the switch actuator assembly of FIG. 5 in a second operative condition.

FIGS. 5 and 6 illustrate operation of one of the toggle-type switch actuator assemblies 14 of FIG. 1. The switch actuator assembly 14 includes a manually engageable member 302 and a pivot pin 304. The pivot pin 304 is located between opposite end portions 306 and 308 of the member 302. The pivot pin 304 supports the manually engageable member 302 on a substrate, such as a printed circuit board 309, for pivotal movement relative to the substrate.

The switch actuator assembly 14 also includes opposed optical transmitter and receiver pairs 310, 312 and 314, 316 mounted to the circuit board 309, adjacent the respective end portions 306 and 308 of the switch assembly 14. Each optical transmitter 310 and 314 is substantially identical to the light source 112 (FIG. 2) described above. The optical transmitters 310 and 314 each transmit light, indicated respectively at 318 and 320, in the direction of the corresponding optical receiver 312 and 316. Each optical receiver 312 and 316 preferably is an LED configured to be responsive to the wavelength of light 318 and 320, such as in the infrared range, emitted from its corresponding optical transmitter 310 and 314.

Two shutters 322 and 324 extend from the manually engageable member 302 in a direction generally toward the PC board 309. The shutter 322 is located between the optical transmitter and receiver pair 310, 312. The shutter 324 is located between the optical transmitter and receiver pair 314, 316.

As the toggle switch assembly 14 is pivoted relative to the circuit board 309, one or the other of the shutters 322 and 324 is moved between its associated optical transmitter and receiver pair 310, 312 or 314, 316 to impede the passage of light from the transmitter to the receiver. As shown in FIG. 6, for example, if force is applied by a finger 328 to the end portion 306 of the manually engageable member 302, the shutter 322 is positioned so as to prevent light 318 from the optical transmitter 310 from reaching the optical receiver 312. In a similar manner, the other end portion 308 of the member 302 may be moved toward the PC board 309 so as to urge the shutter 324 between the optical transmitter 314 and the optical receiver 316 and, thereby, prevent the light 320 from being received at the receiver 316.

Preferably, the detection and switch circuitry associated with the switch actuator assembly 14 is substantially identical to that described above. Each optical receiver 312 and 316 is electrically connected with a suitable amplifier circuit 330 and 332, respectively. Each amplifier 332 and 330 provides an amplified signal to a switch device 334. The amplified signal is indicative of the operative condition of the respective optical receivers 312 and 316. The switch device 334 responds by providing a signal indicative of the state of each optical receiver 312 and 316. In this way, the operative condition of each optical receiver 312 and 316 is monitored and may be used to control associated electronic equipment.

In view of the foregoing description of the structure of the optical switch apparatuses described above, it can be seen that the present invention also provides a method for controlling an electrical switch element in response to the passage of light from a light source to an adjacent LED receiver. The light is supplied from the light source and is received at the corresponding LED receiver. Upon receiving the light from the light source, the LED receiver conducts electrical current in a reverse bias mode.

The electrical switch element is activated in a first operative state in response to the electrical current flowing through the LED receiver in the reverse bias mode. However, upon interrupting the passage of light from the light source to the LED receiver, the flow of electrical current through the LED receiver is terminated. This, in turn, effects a change in the operative state of the switch element from the first operative state, in which it is active to provide a first logic signal, to a second operative state, in which the switch element is inactive, thereby providing a second logic signal.

Advantageously, the switch apparatus of the present invention requires only a mechanical barrier to interrupt the passage of light between the light source and the light receiver. There are no electrical contacts to wear or corrode, thereby tending to provide for an increased number of operating cycles with each such switch actuator assembly. In addition, where a plurality of such optical switch apparatuses are used, a common light source may provide light in the direction of a plurality of the LED receivers, thereby reducing the number of required components.

No electric current is conducted through the movable portion of the switch actuator assembly, as typically occurs in most mechanical switches. Accordingly, the use of light as a switch medium electrically isolates the user from the current carrying portion of the electrical system.

From the above description of the invention, those skilled in the art will perceive improvements, changes and modifications. For example, two or more of the optical switch apparatuses described above may be connected in a switch array. In addition, numerous other circuit arrangements may be used to derive an appropriate output signal in response to the operative condition of the LED receiver. Such improvements, changes and modifications within the skill of the art are intended to be covered by the appended claims.

Having described the invention, I claim:

1. An optical switch apparatus comprising:
   a light source that emits light;
   a first light emitting diode which, in response to receiving light from said light source, has a biased condition in which said first light emitting diode is effective to conduct electrical current and which in the absence of receiving sufficient light from said light source has an unbiased condition; and
   a switch element operatively connected with said first light emitting diode and responsive to the condition of said first light emitting diode, said first light emitting diode effecting operation of said switch element in a first operative state when said first light emitting diode is in the biased condition, said first light emitting diode effecting operation of said switch element in a second operative state different from the first operative state when said first light emitting diode is in the unbiased condition.

2. An apparatus as set forth in claim 1 wherein said first light emitting diode operates in a reverse bias mode when in the biased condition.

3. An apparatus as set forth in claim 1 wherein said first light emitting diode has a cathode electrically connected with a first voltage potential and an anode electrically connected with a second voltage potential, the second voltage potential being less than the first voltage potential, said first light emitting diode conducting electric current in a reverse bias mode upon receiving light from said light source, thereby effecting operation of said switch element in the first operative state.

4. An apparatus as set forth in claim 3 further comprising an amplifier having an input electrically connected with one of said anode and cathode of said first light emitting diode, said amplifier having an output which provides an output signal to said switch element, the output signal having a first value to effect operation of said switch element in the first operative state while said first light emitting diode is conducting electric current and having a second value to effect operation of said switch element in the second operative state when said first light emitting diode is not conducting electric current in the reverse bias mode.

5. An apparatus as set forth in claim 4 wherein said switch element includes a transistor.

6. An apparatus as set forth in claim 5 wherein said transistor is a bipolar junction transistor having a base electrically connected with the output of said amplifier, an emitter electrically connected to a third voltage potential, and a collector operatively connected to a fourth voltage potential having a value which is greater than the value of the third voltage potential.

7. An apparatus as set forth in claim 6 wherein said collector defines an output operative to provide a switched logic output signal having a value substantially equal to the fourth voltage potential in response to the second value of the output signal of said amplifier and the switched logic output signal having a value which approximates the third voltage potential in response to the first value of the output signal of said amplifier.

8. An apparatus as set forth in claim 1 wherein the first operative state of said switch element defines an ON condition of said switch element in which electric current is conducted through said switch element and the second operative state defines an OFF condition of said switch element.

9. An apparatus as set forth in claim 1 wherein said light source comprises a second light emitting diode operating in a forward biased condition in which said second light emitting diode emits light for receipt by said first light emitting diode.

10. An apparatus as set forth in claim 9 wherein said second light emitting diode emits light of a predetermined wavelength, said first light emitting diode being configured to operate in the reverse bias mode in response to receiving light which includes the predetermined wavelength.

11. An apparatus as set forth in claim 1 further comprising:
a second light emitting diode that emits light;
a third light emitting diode which, in response to receiving light from said second light emitting diode, has a biased condition in which said third light emitting diode is effective to conduct electrical current and which has an unbiased condition in the absence of receiving sufficient light from said second light emitting diode, said light source and said first light emitting diode defining a first transmitter-receiver pair and said second and third light emitting diodes defining a second transmitter-receiver pair located adjacent said first transmitter-receiver pair; and,
a shutter mechanism for interrupting the passage of light between one of said first and second transmitter-receiver pairs, said switch element providing an output signal having a value responsive to the operative condition of said first and third optical light emitting diodes, said first and third light emitting diodes effecting operation of said switch element according to the operative condition of said first and third light emitting diodes.

12. A method for controlling an electric switch element in response to the passage of light from a light source to an adjacent light emitting diode, said method comprising the steps of:
supplying light from the light source;
receiving light from the light source at the adjacent light emitting diode;
upon receiving light from the light source, conducting electrical current through the adjacent light emitting diode in a reverse bias mode; and
in response to said step of conducting electrical current through the adjacent light emitting diode, effecting operation of the electrical switch element in a first operative state.

13. The method of claim 12 further comprising the steps of:
interrupting the passage of light from the light source to the adjacent light emitting diode;
upon interrupting the passage of light from the light source to the adjacent light emitting diode, terminating the electrical current through the adjacent light emitting diode; and
in response to the step of terminating the electrical current through the light emitting diode, changing the operative state of the electric switch element from the first operative state to a second operative state which is different from the first operative state.

14. A switch apparatus for controlling operation of an electrically actuatable device, said switch apparatus comprising:
electric circuitry having a first condition enabling actuation of said electrically actuatable device and a second condition disabling actuation of said electrically actuatable device;
an optical transmitter for providing light in a first direction; and
an optical receiver for receiving said light from said optical transmitter, said optical receiver comprising a first light emitting diode;
said electric circuitry changing between the first condition and the second condition in response to the prevention of at least a substantial part of said light from being received at said optical receiver.

15. A switch apparatus as set forth in claim 14 wherein said first light emitting diode operates in a reverse bias mode in response to receiving light from said optical transmitter.

16. A switch apparatus as set forth in claim 15 wherein said optical transmitter is a second light emitting diode that emits light of a predetermined wavelength which is the same wavelength as that of the light emitted by the first light emitting diode.

17. An optical switch apparatus comprising:

first and second spaced apart optical transmitters which emit light in a predetermined direction;

first and second optical receivers positioned adjacent a corresponding one of said first and second optical transmitters for receiving light therefrom, said first and second optical receivers each having a first operative condition in response to receiving light from the corresponding one of said first and second optical transmitters, said first and second optical receivers each having a second operative condition when not receiving light from the corresponding one of said first and second optical transmitters;

a pivoting shutter mechanism having means for interrupting the passage of light from one of said first and second optical transmitters to the corresponding one of said first and second optical receivers; and an electric switch element operatively connected with each of said first and second optical receivers, said switch element providing an output having a value responsive to the operative condition of said first and second optical receivers, said first and second optical receivers effecting operation of said switch element according to the operative of said first and second light receivers.

18. An optical switch apparatus as set forth in claim 17 wherein each of the first and second optical receivers includes a light emitting diode which operates to conduct electrical current in a reverse bias mode in response to receiving light from the corresponding one of said first and second optical transmitter.

* * * * *